United States Patent [19]

Wakasugi

[11] Patent Number: 4,992,740
[45] Date of Patent: Feb. 12, 1991

[54] APPARATUS WHICH USES A SIMULATED INDUCTOR IN THE MEASUREMENT OF AN ELECTRICAL PARAMETER OF A DEVICE UNDER TEST

[75] Inventor: Tomio Wakasugi, Hachioji, Japan

[73] Assignee: Hewlett-Packard, Palo Alto, Calif.

[21] Appl. No.: 351,104

[22] Filed: May 12, 1989

[30] Foreign Application Priority Data

Jun. 28, 1988 [JP] Japan .............................. 63-85323[U]

[51] Int. Cl.⁵ ........................ G06G 7/62; G01R 27/00
[52] U.S. Cl. ..................................... 324/649; 364/802
[58] Field of Search ............... 324/605, 606, 609, 649, 324/650, 654, 691, 713; 364/802

[56] References Cited

U.S. PATENT DOCUMENTS 4,409,543 10/1983 Sugihara .............................. 324/659
4,481,464 11/1984 Noguchi et al. ..................... 324/650

FOREIGN PATENT DOCUMENTS 0041961 4/1978 Japan ................................... 364/802

OTHER PUBLICATIONS

Solimon, A Grounded Inductance Simulation Using the DVCCS/DVCVS, Proceedings of the IEEE, vol. 66, No. 9, 4/1978, pp. 1089-1091.

Primary Examiner—Reinhard J. Eisenzopf
Assistant Examiner—Jack B. Harvey
Attorney, Agent, or Firm—Woodcock, Washburn, Kurtz Mackiewicz & Norris

[57] ABSTRACT

An active, artificial inductor circuit is utilized as a two-terminal pair circuit used to provide an apparatus capable of measuring the AC electrical parameters of a device such as a resistor, a capacitor or an inductor at a desired frequency with less error in measuremeemt at lower frequencies.

7 Claims, 4 Drawing Sheets

4,992,740

APPARATUS WHICH USES A SIMULATED INDUCTOR IN THE MEASUREMENT OF AN ELECTRICAL PARAMETER OF A DEVICE UNDER TEST

FIELD OF THE INVENTION

The present invention relates to a circuit element measuring apparatus for measuring circuit parameters such as inductance and capacitance. More particularly, the present invention pertains to a circuit element measuring apparatus used to measure circuit parameters of a device under test (hereinafter referred to as "DUT") using a measurement signal of a desired frequency with a DC bias being applied to the DUT.

BACKGROUND OF THE INVENTION

A measuring circuit such as that shown in FIG. 2 has heretofore been employed to measure the impedance or the like of a DUT using a desired signal with a DC bias voltage being applied to the DUT. In the figure, a capacitor 212 and an inductor 211 are provided to prevent a null detecting amplifier 203 from being saturated by a large DC signal which would otherwise flow through a current detecting resistor Rr from a DC bias voltage source 208. The capacitor 212 is employed to block DC signals, while the inductor 211 is employed to constitute a return path of DC signals. A measurement signal from a measurement signal source 206 is added to a DC signal from the DC bias voltage source 208 by an adding means 207 and added to one end of a DUT 205. On the other hand, the other end (the point G) of the DUT 205 is virtually grounded in an alternating current manner by the null detecting amplifier 203; therefore, the signal voltage from the measurement signal source 206 directly represents the voltage across the DUT 205. Ideally, all the measurement signal flowing through the DUT 205 flows through the current detecting resistor Rr. Thus, if the voltage across the DUT 205 is represented by VAD and the voltage across the current detecting resistor Rr by VAR, the impedance ZDUT of the DUT 205 may be expressed as follows:

ZDUT=Rr.VAD/VAR (VAD and VAR are vector voltages)

However, the magnitude of inductance of the inductor 211 has its limit. Particularly in a low-frequency region, no sufficiently large impedance can be obtained, so that part of the measurement signal flows outvia the inductor 211, resulting in an error in the measurement of impedance. Further, the DC resistance of the inductor 211 causes a DC offset voltage to be generated at the point G by the DC bias current flowing through the inductor 211, which results in an error in the DC bias voltage applied to the DUT 205.

To solve these problems, Japanese Utility Model Application No. 63-29322 (1988) discloses an arrangement wherein an active simulated inductor such as that shown in FIG. 3 is employed in place of the passive inductor 211. Since the simulated inductor can have a considerably large inductance and also has a small DC resistance, it is possible to conduct measurement with a high degree of accuracy even when the impedance of a DUT is measured with a high DC bias voltage being applied to the DUT. It is also possible to set a DC bias voltage with a high degree of accuracy.

However, when the DUT 205 is connected to a circuit element measuring apparatus 10 through four coaxial cables H$_{CUR}$, H$_{POT}$, L$_{POT}$ (length: 1 m, for example) to measure a circuit parameters, for example, impedance, of the DUT, as shown in FIG. 4, some problems arise. First of all, when a simulated inductor is connected to the point L in the figure, the simulated inductor must be disposed within a measuring jib (test fixture) employed to detachably secure the DUT 205, which leads to a rise in the cost of the test fixture and an increase in the size thereof. When a simulated inductor is connected to the point S in the figure, the AC potential at the point S is affected by the inductive and resistive components of the cable L$_{CUR}$ so that it becomes different from the potential (approximately equal to the ground potential) at the point L. Accordingly, the measurement current flows through the simulated inductor, resulting in an error in the measurement current flowing through the current detecting resistor Rr, which leads to an error in measurement. This is because the impedance of the simulated inductor cannot be increased due to the reasons that the electrical characteristics of the simulated inductor are equal to those of the voltage controlled current source (VCCS) 303 at high frequencies above the band width of the loop and that a high power transistor having a large stray capacitance is employed for the VCCS in order to increase the amount of absorption of DC current. In addition, the larger the amount of current absorbed by the simulated inductor, the larger the potential difference between the DC potential at the Point L and the DC potential (approximately equal to the ground potential) at the point S due to the effect of the resistive component of inner wire of the cable L$_{CUR}$. Therefore, an error is invited in setting of a DC bias voltage applied to the DUT 205.

SUMMARY OF THE INVENTION

It is an advantage of the present invention to provide a circuit element measuring apparatus which is designed so that a DC bias voltage which is to be applied to a DUT can be set with a high degree of accuracy and measurement of circuit parameters in a high frequency region can also be effected with a high degree of accuracy.

According to one embodiment of the present invention, the above-described active simulated inductor is not arranged in the form of a two-terminal network but in the form of a two-terminal pair network and the voltage sense terminal and the current force (absorption) terminal are separated from each other.

The voltage sense terminal of the simulated inductor is connected to a point close to the terminal of a current detecting resistor on the side thereof which is closer to a DUT, and the terminal of a VCCS element for absorbing a DC bias current is connected to a point close to an input terminal of a null detecting amplifier. By virtue of this arrangement, the measurement current flowing through the current detecting resistor Rr is free from errors, and the DC potential at the terminal of the DUT 205 on the side thereof which is close to the current detecting resistor Rr can be made substantially zero. Therefore, it is possible to set a DC bias voltage applied to the DUT with a high degree of accuracy and measure circuit parameters with a high degree of accuracy.

BRIEF DESCRIPTION OF THE DRAWINGS

FIG. 4 is a schematic circuit diagram showing a conventional circuit element measuring apparatus used when a DUT is measured through coaxial cables.

DETAILED DESCRIPTION OF THE INVENTION

Figure 1:
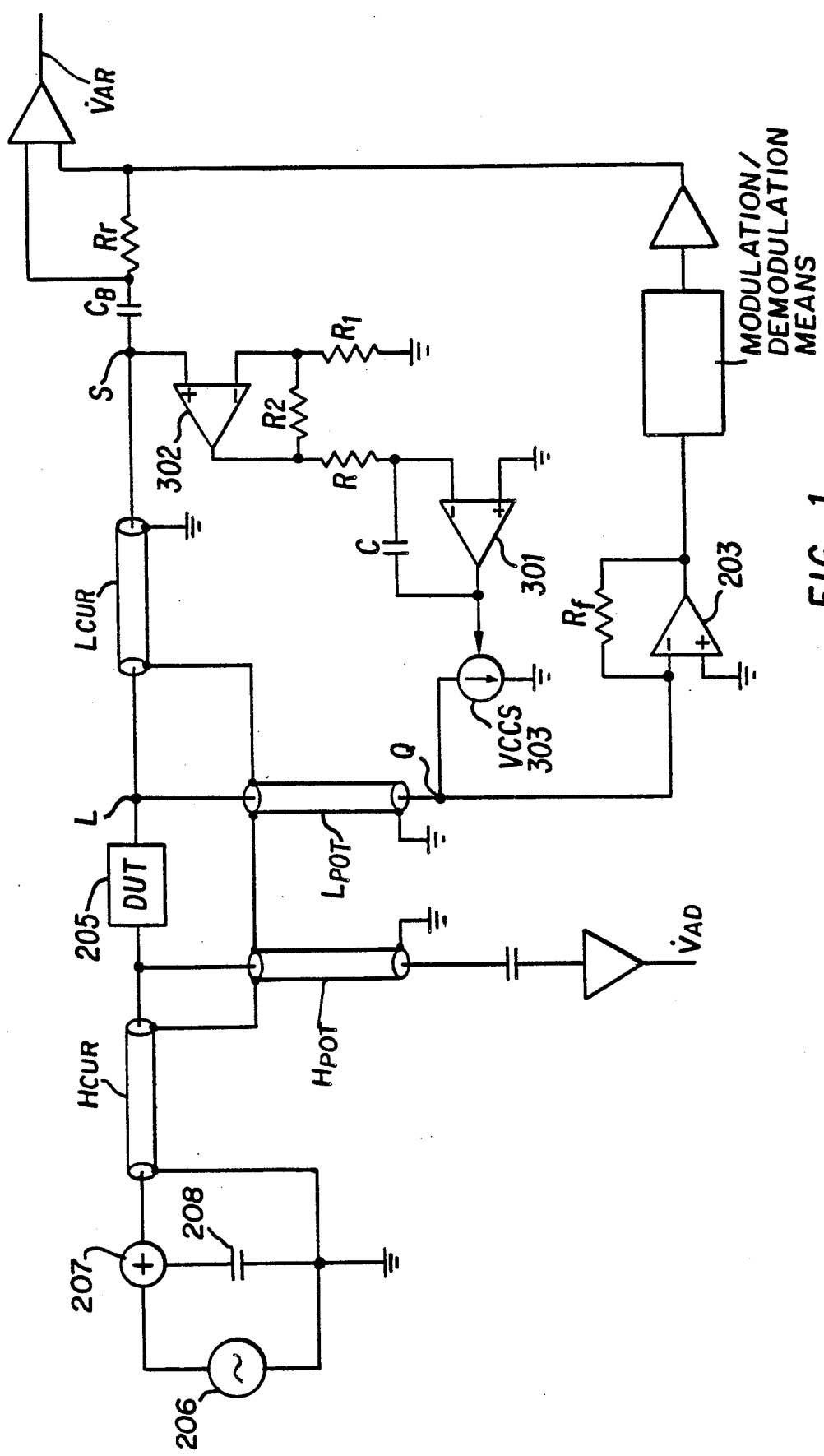
FIG. 1 shows one embodiment of the present invention.
Figure 2:
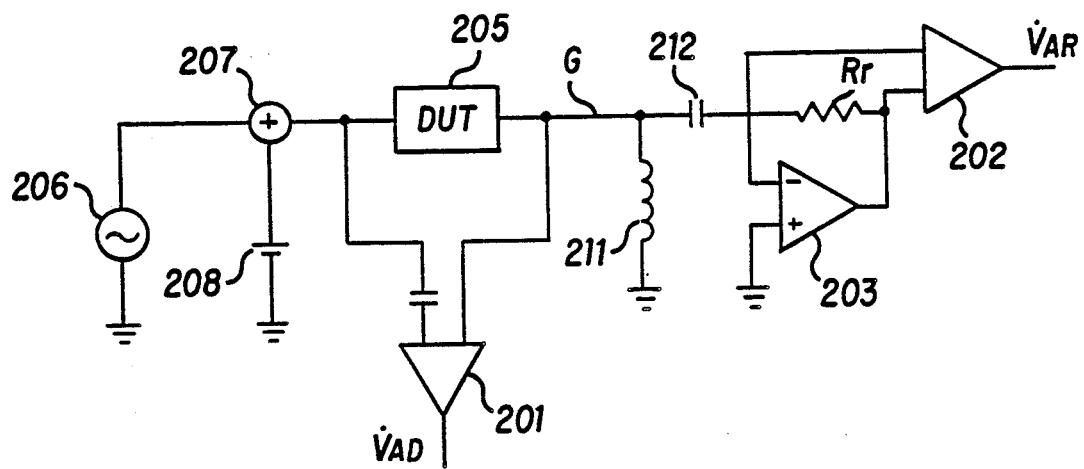
FIG. 2 is a schematic circuit diagram showing a conventional circuit element measuring apparatus.
Figure 3A:
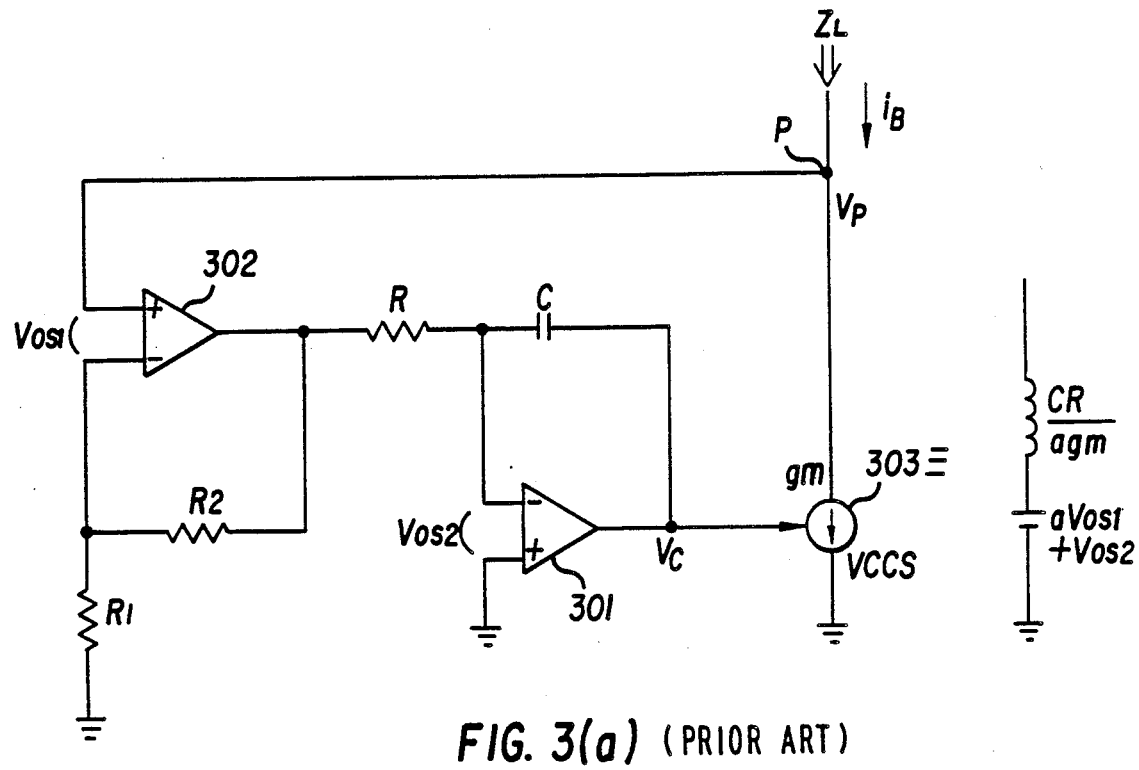
FIG. 3(a) shows the arrangement of an active simulated inductor.
Figure 3B:
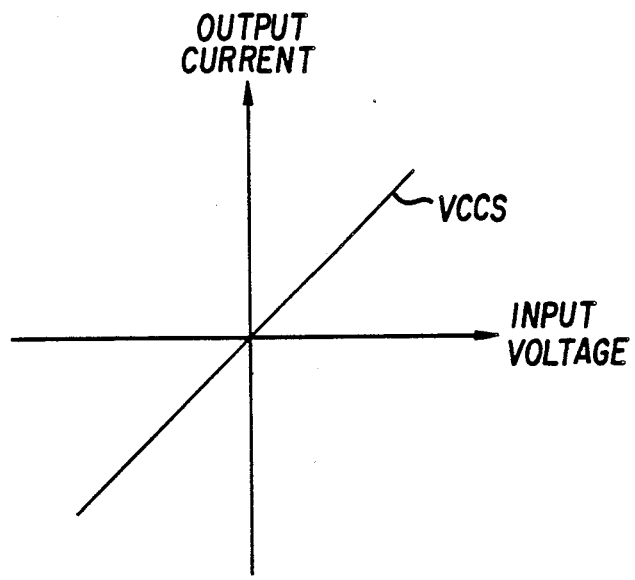
FIG. 3(b) shows the voltage/current relationship of the voltage controlled current source shown in FIG. 3(a)

One embodiment of the present invention is shown in FIG. 1 which is a partial diagrammatic view. The arrangement of the active simulated inductor that is shown in FIG. 3 is changed such that the line from the point P which is connected to an input terminal of the amplifier 302 and the line from the point P which is connected to the VCCS 303 are separated from each other to constitute a two-terminal pair network, and the active simulated inductor arranged in the form of a two-terminal pair network is applied as in the embodiment shown in FIG. 1. In FIG. 1, the voltage sensing amplifier 302 senses a level of voltage at the node S between the cable $L_{CUR}$ and the capacitor $C_B$ connected to the current detecting resistor Rr and amplifies the sensed voltage. The output of the amplifier 302 is integrated in an integrator which is comprised of a capacitor C, a resistor R and an amplifier 301. This integrator also functions as a low-pass filter. The output of the integrator is input to a voltage controlled current source (VCCS) 303. In accordance with the input voltage, the output current of the VCCS 303 varies and hence the amount of absorption of DC bias current varies. By this operation, a simulated inductor is produced. The input impedance of the voltage sensing amplifier 302 can be made satisfactorily higher than in the case where the VCCS element is connected to the point S even in a high-frequency region. Accordingly, there is no adverse effect on the measurement current flowing through the current detecting resistor Rr. On the other hand, the VCCS 303 that is connected to the node between an input terminal of the null detecting amplifier 203 and the cable $L_{POT}$ has no error current flowing therethrough because the AC potential at the node Q is substantially zero. Since no DC current flows through the cable $L_{CUR}$, there is no DC voltage drop due to the cable $L_{CUR}$. Accordingly, it is the same as the case where the DC potential at the point L, that is, one end of the DUT 205, is sensed. Therefore, the DC potential at the point L can be made substantially zero. Thus, it is possible to set a DC bias voltage supplied to the DUT 205 with a high degree of accuracy and also measure circuit parameters with a high degree of accuracy.

As has been described above, employment of the present invention enables a DC bias voltage applied to a DUT to be set with a high degree of accuracy and also permits measurement of circuit parameters in a high-frequency region to be effected with a high degree of accuracy.

What we claim:

1. In a circuit element measuring apparatus having a measurement signal source, a DC bias power source, a device under test which is connected at one end thereof to both said measurement signal source and said DC bias power source, a current detecting resistor connected at one end thereof to the other end of said device, and a null detecting amplifier connected to said the other, or second, end of said device to virtually ground said second end, the improvement which comprises:
voltage sensing amplifier means connected to said one, or first, end of said current detecting resistor to detect and amplify a voltage at said first end;
low-pass filter means connected to the output of said voltage sensing amplifier means; and
voltage controlled current source means connected at one end thereof to the output of said low-pass filter means and at the other end thereof to an input terminal of said null detecting amplifier to absorb or supply a DC current from the input end of said null detecting amplifier in accordance with the output of said low-pass filter means.

2. An apparatus for measuring at least one electrical parameter of a device under test (DUT), the DUT having a first terminal and a second terminal, adapted to be connected to a measurement signal source and a DC bias source, the apparatus comprising:
(a) means for measuring the AC voltage across the DUT;
(b) first and second coaxial cables coupled to the second terminal of the DUT;
(c) a current detecting resistor coupled through at least the first coaxial cable to the second terminal of the DUT;
(d) a simulated inductor comprising,
(i) a first terminal coupled through the first coaxial cable to the second terminal of the DUT;
(ii) a second terminal coupled through the second coaxial cable to the second terminal of the DUT;
(iii) a null detecting amplifier coupled to the second terminal (ii); and
(iv) a voltage controlled current source (VCCS) coupled between the second terminal (ii) and ground;
whereby said electrical parameter is determined from the voltage measured across the DUT and the current through the DUT.

3. Apparatus of claim 2 further comprising:
(e) means for measuring one of the AC current through or voltage across the current detecting resistor.

4. Apparatus of claim 2 wherein the simulated inductor further comprises:
(v) amplifier means having a first input coupled to the first terminal (i); and
(vi) integrator means having an input terminal coupled to an output of amplifier means (v), and an output coupled to a control input of the VCCS.

5. Apparatus of claim 2 further comprising a DC blocking capacitor coupled between the current detecting resistor and the first coaxial cable.

6. Apparatus of claim 2 wherein the electrical parameter to be measured is the impedance $Z_{DUT}$ of the DUT.

7. Apparatus of claim 6 wherein the impedance $Z_{DUT}$ is calculated by the equation, $$ZDUT = R_r \frac{VAD}{VAR},$$

wherein $R_r$ is the resistance of the current detecting resistor, VAD is the voltage across the DUT, and VAR is the voltage across the current detecting resistor.

* * * * *